United States Patent [19]
Aubert

[11] Patent Number: 4,820,982
[45] Date of Patent: Apr. 11, 1989

[54] DEVICE FOR EXPLORING THE INNER VOLUME OF A CYLINDER AND AN INVESTIGATION SYSTEM EQUIPPED WITH THIS DEVICE

[75] Inventor: Guy Aubert, Grenoble, France

[73] Assignee: Thomson-CGR, Paris, France

[21] Appl. No.: 31,617

[22] Filed: Mar. 30, 1987

[30] Foreign Application Priority Data

Apr. 1, 1986 [FR] France .............................. 86 04591

[51] Int. Cl.[4] .......................................... G01R 33/20
[52] U.S. Cl. .................................................. 324/300
[58] Field of Search ............... 324/205, 219, 220, 262, 324/300, 301, 221; 73/866.5, 623; 33/178 E; 356/241; 378/59, 60; 250/358.1, 359.1

[56] References Cited

U.S. PATENT DOCUMENTS

| | | | |
|---|---|---|---|
| 3,831,084 | 8/1974 | Scalese et al. | 324/219 |
| 3,959,767 | 5/1976 | Smither et al. | 340/858 |
| 3,984,627 | 10/1976 | Galerne | 33/304 |
| 4,304,134 | 12/1981 | Rouse et al. | 324/220 |
| 4,441,078 | 4/1984 | Lecomte | 324/219 |
| 4,654,702 | 3/1987 | Tolino et al. | 358/100 |
| 4,710,710 | 12/1987 | Flora et al. | 73/866.5 |

FOREIGN PATENT DOCUMENTS 2704396 8/1978 Fed. Rep. of Germany .
1452280 10/1976 United Kingdom .

OTHER PUBLICATIONS

Patents Abstracts of Japan, vol. 9, No. 203 (P-381), [1926], Aug. 21, 1985 & JP-A-60 67 862.
Rev. Scientif, Instrum., vol. 48, No. 9, Sep. 1977, p. 1215, New York US; J. F. Wendelken et al., "Simple Goniometer for Precise Grinding and Electropolishing of Single Crystal Surfaces".

Primary Examiner—Michael J. Tokar
Assistant Examiner—Kevin D. O'Shea
Attorney, Agent, or Firm—Oblon, Fisher, Spivak, McClelland & Maier

[57] ABSTRACT

A device is provided for exploring the inner volume of a cylinder, including a probe holder driven with a translational movement by a shaft and with a pivoting movement by a mandrel along and about the axis of the cylinder. By placing probes in housings previously formed in the probe holder, all the points inside the cylinder may be reached. The operations are carried out from inside the cylinder. The device further includes apparatus for fixing and adjusting the position of a framework holding the shaft. Associated devices allow predetermined positions to be reached not only along the axis but also in angular orientation.

18 Claims, 2 Drawing Sheets

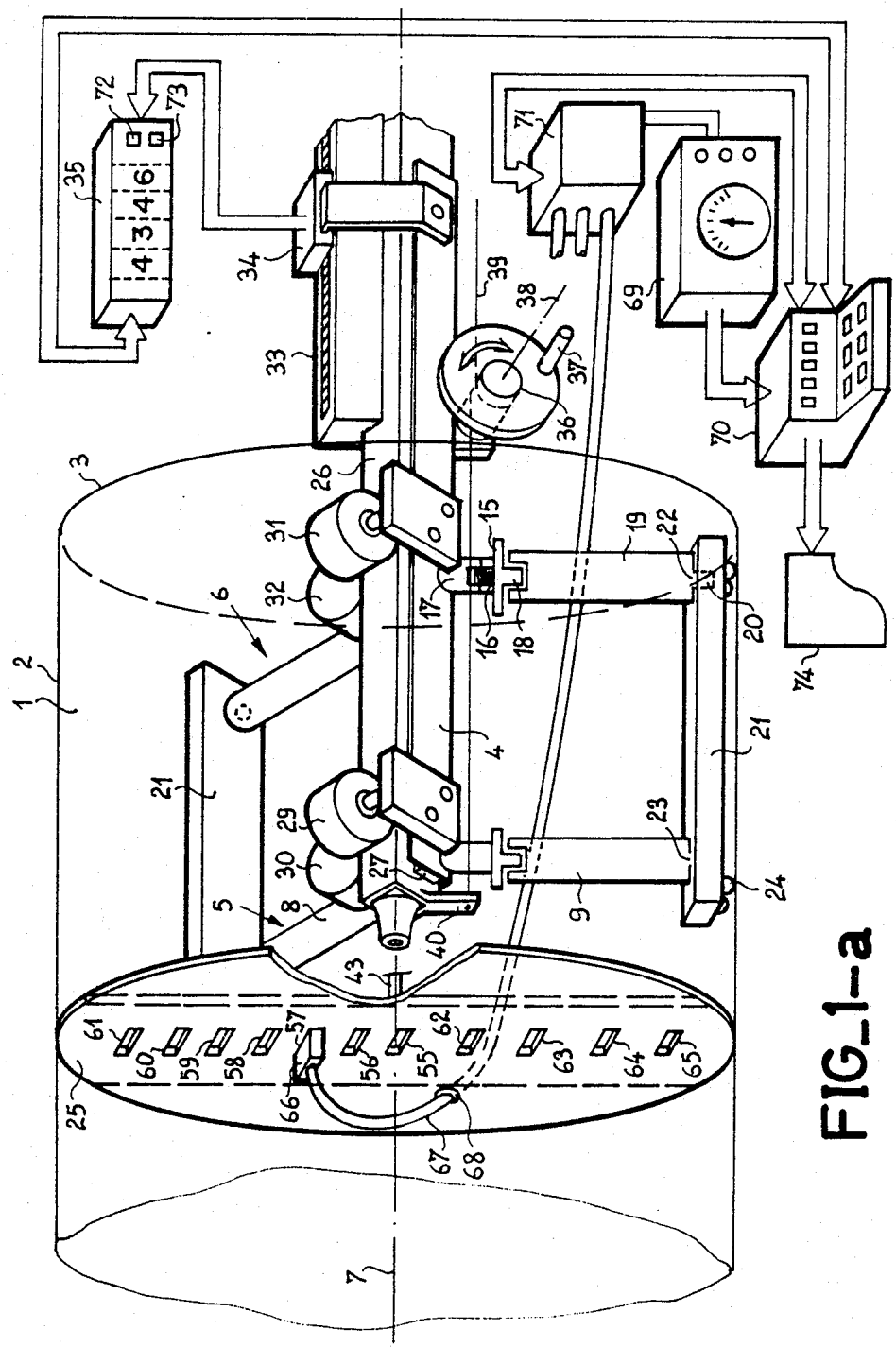
FIG_1-a

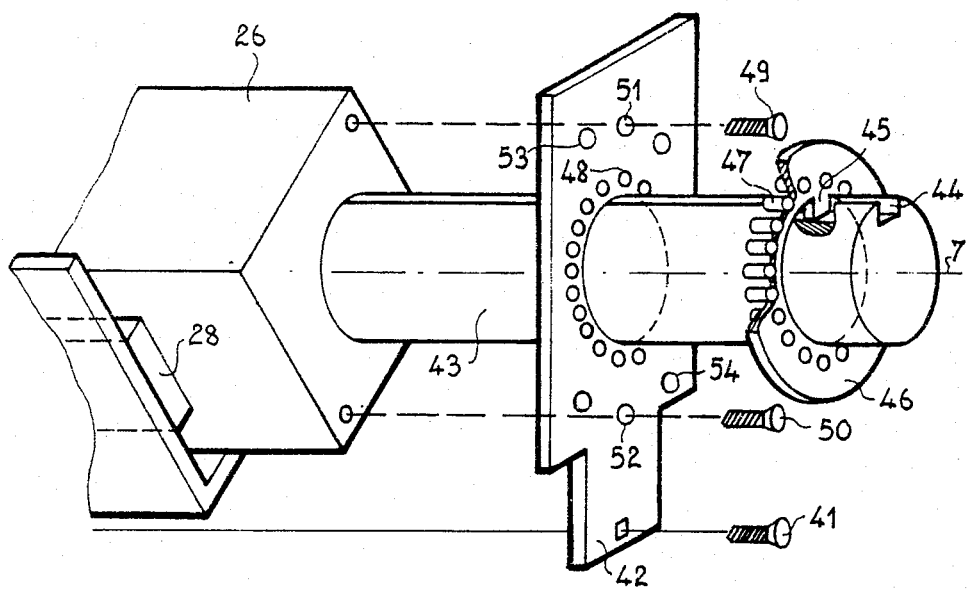
FIG_1-b
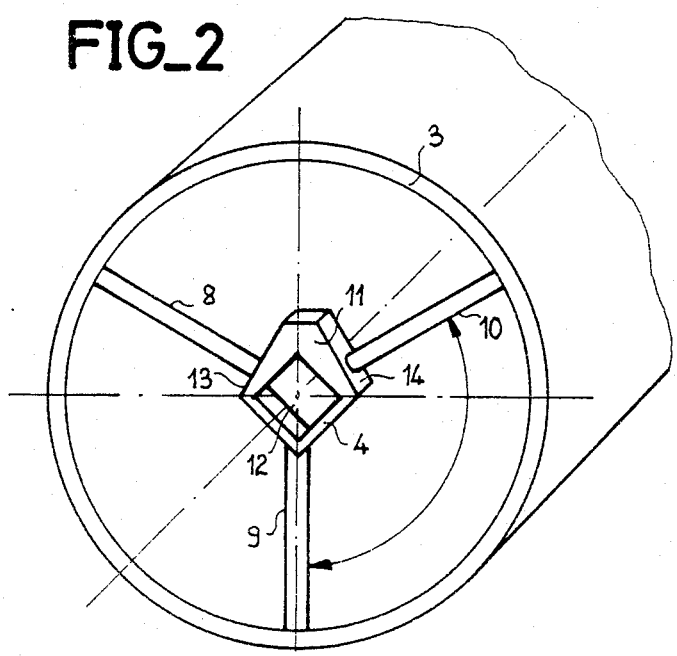
FIG_2

DEVICE FOR EXPLORING THE INNER VOLUME OF A CYLINDER AND AN INVESTIGATION SYSTEM EQUIPPED WITH THIS DEVICE

FIELD OF THE INVENTION

The present invention relates to a device for exploring the inside of a cylindrical volume, in particular a magnet. It may find an application in the medical field where magnets are used for forming images by nuclear magnetic resonance. It may, however, be used in other fields, in particular for other cylindrical magnets, or else in other fields where cylindrical volumes are met with.

BACKGROUND OF THE INVENTION

The nuclear magnetic resonance image formation, it is necessary to place a body, sections of which it is desired to form as images, inside a continuous, intense and homogeneous magnetic field produced by a magnet. To improve the qualities of homogeneity of the magnet, it is necessary to know its inhomogeneity. The inhomogeneity of a magnet is measured by recording the values of the magnetic field produced at different positions of the volume concerned thereof. For this, a probe is moved to these different positions: the volume concerned is explored. It is known, in particular in magnetic resonance image formation, that the field must be homogeneous with a homogeneity of the order of a few parts per million (ppm). Therefore the positions in the inner volume where the field values are recorded must be located geometrically with as high a precision as possible. It also happens sometimes that the measurements must be reiterated, at the same positions of the magnet, after field corrections have been made. It is therefore necessary, besides the precision, to have equipment which is easy to handle. Finally, since the knowledge of the field produced by a magnet is all the higher the greater the number of points at which the field values have been able to be recorded, it is necessary for the exploration device to be simple in use.

SUMMARY OF THE INVENTION

The present invention provides an exploration device which provides an overall solution to all these problems. For handling and installation, the device includes a framework with means for securing it and adjusting it inside a cylinder to be explored. Once the framework is positioned, the device further includes a probe holder able to effect a translational movement parallel to the axis of the cylinder, and being pivotable about this axis. Finally, for the sake of simplicity, the probe holder has predetermined housings for receiving exactly the measuring probe. Thus, by choosing one housing out of all the housings, all the inner points of a cylinder, whose distance to the axis of the cylinder is the same, are explored by successive translational and/or rotational operations. Furthermore, by changing the place of the probe from one housing to another, all the desired radial distances are explored. Several probes may also be disposed simultaneously in the housings and the corresponding radial distances explored by manual or electronic switching of the probes.

The invention relates to a device for exploring the inner volume of a cylinder comprising a framework serving as support, means for fixing and adjusting the framework in position in the cylinder, a probe holder, means for sliding the probe holder along the axis of the cylinder, and means for pivoting the probe holder about the axis of the cylinder, the probe holder including predetermined housings for receiving a measuring probe.

BRIEF SUMMARY OF THE DRAWINGS

The invention will be better understood from reading the following description with reference to the accompanying Figures. They are given solely by way of illustration and are in no wise limitative of the invention. In the different Figures, the sizes and proportions of the different elements have not been respected. However, the same references designate the same elements.

FIG. 1a is a perspective view of the device of the invention, showing the means for sliding the probe holder and the probe holder itself.

FIG. 1b is a perspective view of the means for pivoting the probe holder is and

FIG. 2 is a schematical perspective view of the means for fixing the framework.

DESCRIPTION OF THE PREFERRED EMBODIMENT OF THE INVENTION

FIGS. 1a and 1b show the exploration device of the invention. The inner volume to be explored is represented by the drawing of a cylinder 1 with generatrix 2 and of circular cross section 3. The exploration device includes a framework whose elements are numbered from 4 to 24. This framework includes essentially a slide 4 supported for example by two sets of spacers respectively 5 and 6 each including three spacers. The three spacers of each set are each placed in a different plane substantially perpendicular to the axis 7 of the cylinder 1. In one example, the two planes are spaced apart by about 30 cm. In their respective plane, the spacers are oriented in directions forming therebetween angles substantially equal to 120°. In the perspective representation of FIG. 1a, one of the spacers of each plane has been omitted so as not to overload the drawing. FIG. 2 shows schematically the position of spacers 8 and 9 shown in FIG. 1a, and of spacer 10 which has not been shown there. These spacers are secured to the slide 4 at one of their ends, by any means, particularly by means of a pentagonal piece 11 with an aperture 12 and two faces respectively 13 and 14 serving as base for the spacers 8 and 10.

The aperture 12 serves for the translation of the probe holder.

Each of the six spacers of the framework has a disk shaped adjusting wheel 15. One of the faces of each wheel includes a threaded stub 16 for engagement in a nut 17 fixed to the framework (piece 11), whereas the other face is provided with a smooth cylindrical stub 18. The smooth stub 18 is provided for engagement in a hole formed in the base of a spacer element 19. Each spacer element also has, at its head, a smooth cylindrical stub 20. The spacer elements may be of different lengths, and possibly fitted one in the other so as to form a larger spacer. For this reasons, the diameters of the smooth stubs 20 of the spacers are compatible with the holes made in their base. During installation of the exploration device inside the cylindrical volume, the smooth stubs 20 of the heads of the spacers are provided so as to be fitted into elementary floors such as 21. Each floor has on its face two holes, for example 22 and 23, for receiving the smooth stubs 20 of two spacers, for example 9 and 19, parallel to each other but situated in different planes. On another face, so as to prevent the floors 21 from damaging the inner face of the cylinder 1, they are provided with shoes 24 made from a plastic material. By adjusting all the wheels 15 of all the spacers, it is possible to fix the framework with respect to the cylinder 1 at the same time as the position of this framework is adjusted so that subsequently a probe holder 25 may pivot exactly about the axis 7 of the cylinder 1. The holes in the floors 21 and in the bases of the spacers are slightly wider than the smooth stubs 18, 20 so as to facilitate the accomplishment of this adjustment by the mechanical play thus provided. By thus bearing on the inner wall of the cylinder 1, the device of the invention overcomes all the problems of fixing the cylinder 1 on a support.

The exploration device further includes means for sliding the probe holder 25. These sliding means include a shaft 26 of polygonal (e.g., square) section. The shaft 26 rests on the slide 4 by means of shoes, such as 27 or 28 (FIG. 1b), for sliding with minimal friction. A certain number of the shoes 27, 28 are thus spaced apart along each bearing face of the slide 4. When the shaft 26 is advanced and the cantilever of the probe holder 25 increases, sets of rollers 29, 30 and 31, 32 exert a reaction on the upper faces of the shaft 26. The axes of the rollers 29–32 are held secured to the slide 4. This reaction prevents the shaft 26 from rocking. The section of the shaft 26 is preferably polygonal so that the supports and the reactions may be exerted whatever the position along the x-axis of the shaft 26. On the side opposite that where the probe holder 25 is mounted, a graduated scale 33 is fixed to the shaft 26. The graduated scale 33 comprises a glass beam with evenly spaced grooves which pass in front of an optical coder 34 when the shaft 26 slides. The optical coder 34 counts the grooves and thus allows the position of the end of the shaft 26 along the x-axis to be measured and displayed in a display device 35.

For moving the shaft 26, it is for example provided with a drum 36 integral with a crank handle 37. Manipulation of the crank handle 37 causes the drum 36 to rotate about an axis 38 substantially orthogonal to the axis 7. The drum 36 is mounted on the slide 4. A wire 39, or a cable, is wound for a few turns about the drum 36. One of the ends of the wire 39 is coupled to a stop 40 integral with the shaft 26, near the probe holder 25, whereas the other end of the wire 39 is fixed by means of a tension adjusting screw 41 to an indexing hub 42 also fixed to the shaft 26 at its other end. By operating the crank handle 37, the shaft 26 is caused to slide. This sliding is stopped on both sides with the stop 40 or the indexing hub 42 engages with the ends of the slide 4.

In a preferred example, the means for causing the probe holder 25 to pivot about the axis 7 include a mandrel 43 (FIGS. 1a and 1b) mounted for free rotation inside and in the axis of the shaft 26. At the rear end (FIG. 1b) the mandrel 43 has a longitudinal recess 44 for receiving a lug 45 of an indexing knob 46. The indexing knob 46 includes a ring sliding about the mandrel 43 and having one or a plurality of studs such as 47. This or these studs 47 are provided for engagement in sockets 48 formed oppositely in the indexing hub 46. The sockets 48 are spaced apart evenly thereon about a ring centered on the axis 7 of the indexing hub 42. The indexing hub 42 is fixed to the end of the shaft 26 by any means. For instance, the indexing hub 46 can be fixed to the end of the shaft 26 by means of two screws 49 and 50 which engage respectively in holes 51 and 52 in the indexing hub 42. Once the indexing hub 42 is fixed, the indexing knob 46 is pulled rearwardly, and the lug 45 slides in the longitudinal recess 44. Then the mandrel 43 is rotated through the desired angle, and the indexing knob 46 is pushed forwardly so that the stud 47 is engaged in a socket 48 chosen beforehand. The result is that the other end of the probe holder 25 has pivoted about the axis 7 and has now rotated through a predetermined angle. This angle corresponds to a multiple of the spacing between two adjacent sockets 48 on the indexing hub 42. Thus the cylinder 1 can be explored in radial directions spaced apart from each other by an angle equal to the angular pitch of the sockets 48. If this angular pitch is not sufficiently fine, or for any other reasons, it is possible to shift the indexing hub 42 through a certain angle by removing the screws 49 and 50 and replacing them, after rotating the indexing hub 42, through holes 53, 54 situated respectively at the side of each of the holes 51 and 52. The angular pitch between the holes 51 and 53 and between the holes 52 and 54 is preferably complementary to the angular pitch of the sockets 48. It is also possible to provide coding of the rotation of the mandrel 43 by means of a coder, for example an optical coder, numerous constructions of which are available commercially.

The probe holder 25 is mounted at the end of the mandrel 43. It has a series of housings referenced 55 to 61, spaced apart evenly radially. The housing 55 is situated on the axis 7. If the pitch of distribution of the housings 55 to 61 is not sufficiently fine, it is possible to provide another series of housings 62 to 65 offset radially with respect to those of the first series so as to increase the fineness of the exploration pitch. The other series may, however, also be adapted to an exploration whose radial spacing is different from that of the first series.

All the elements of the exploration device are made from an amagnetic material. In particular, the slide 4 and the shaft 26 are made from aluminium; the sets of spacers, the flors 21, the drum 36, the crank handle 37, the mandrel 43, etc . . . are preferably made from amagnetic plastic material, in particular from that known under the commercial name Delrin. The sliding shoes 27 and 28 and the rollers 29 to 32 are coated with polytetrafluoroethylene.

To use the exploration device of the invention, the framework is first of all installed inside the cylinder 1. To adjust the position of the framework, the following is the way to set about it. The crank handle 37 is operated so that the stop 40 comes to bear on the slide 4. In this position, the spacers 5 are adjusted (i.e., the spacers which are closest to the probe holder 25). Adjustment is reached when a chosen external point of the probe holder 25 may occupy by rotation positions which are all equidistant from the cylinder 1. To facilitate this operation, adjustment may be made with shims applied to the inside of the cylinder 1. When the spacers 5 are adjusted by means of the crank handle 37, the probe holder 25 is moved until the indexing hub 42 comes into abutment at the other end of the slide 4. Then, as for the spacers 5, the spacers 6 are adjusted. There is as a rule no need to alter the adjustment of the spacers 5. In fact, for all that the spacers 5 are the only ones concerned in the preceding adjustment, the adjustment of the spacers 6 is the only effective one in the second step. The whole operation may, however, be reiterated by taking care to replace the probe holder 25 in the adequate positions each time.

Preferably, so as to take into account the bending at the cantilever limit, the spacers 6 are adjusted when a probe 66 is engaged in one of the housings 55-65 of the probe holder 25. The weight of the probe 66 as well as the weight of its supply cable 67 are taken into account for the additional bending which they cause. The same procedure is followed with several probes if several are used. Preferably, the supply cable 67 is brought rearwardly of the device by passing at the side if the probe holder 25 includes a radial piece or through the probe holder 25 through a hole 68 if it is circular. Thus, no tractive force is exerted on the probe 66 so as to modify its position in its housing. When this installation and adjustment are finished, the use properly speaking may begin.

First of all, an operator places the probe 66 in a given housing. He further engages the indexing knob 46 in a given position of the indexing hub 42. Then by means of the crank handle 37, he moves the probe holder 25 along a generatrix of a cylinder inside the cylinder 1. At a predetermined position along the axis 7, using a measuring apparatus 69 (in the example illustrated an NMR gaussmeter), he measures the value of the corresponding field. This value may be stored in a processor 70, then possibly written in a list 74. When all predetermined positions along the axis of the generatrix have been explored, the operator grips the indexing knob 46, pulls it rearwardly, and rotates it thus driving the mandrel 43 through a predetermined angle. After pushing the indexing knob 46 back in again, measurement of the characteristics of the field for the different positions along the axis is then undertaken again. The operation continues thus until the indexing knob 46 comes back to a position identical to that which it occupied at the beginning. At that time, the operator grips the probe 66 and places it in another housing. Then the whole operation is begun again. For moving the probe 66, the operator acts through the other end of the cylinder 1.

So as to avoid having to move the probe 66, several probes may be used simultaneously, each introduced into a housing of the probe holder 25. The supply cables for these probes are then connected to a multiplexer 71 driven by the processor 70. In this preferred example of operation, the exploration procedure is as follows. When the probe holder 25 is oriented in a desired direction, the operator brings the probe holder to a predetermined position along the axis 7. When this predetermined position is reached, the processor 70 sends a validation instruction to the display device 35. Then the processor 70 controls the multiplexer 71 in sequence. The multiplexer 71 connects each of the probes 66 in turn to the measuring apparatus 69. When these measurements are recorded, the processor 70 delivers a go ahead signal which lights up an indicator lamp 72 on the display device 35. The operator may then again move the probe holder 25 so as to reach another chosen position along the axis 7. The processor 70 checks each time that the position along the axis 7 reached corresponds to a predetermined position which has been previously stored in its memory. During the measurement, the crank handle 37 may be disabled. The fact of disablement of the crank handle 37 may be indicated by the lighting up of an indicator lamp 73 also present on the display device 35. On the other hand, if the fixing in a position along the x-axis is not correct, the processor 70 may for example cause the indicator lamp 73 to wink.

The translational and rotational movements of the probe holder 25 may be motorized, and exploration of the volume of the cylinder 1 may then be carried out automatically under the control of the processor 70. Such motorization may preferably use pneumatic means which do not produce any magnetic field.

What is claimed is:

1. A device for exploring the inner volume of the cylinder, said device comprising:
   (a) a framework;
   (b) means for fixing and adjusting the position of said framework in the cylinder;
   (c) a probe holder having housings for receiving at least one measuring probe;
   (d) means for causing said probe holder to slide along the axis of the cylinder; and
   (e) means for causing said probe holder to pivot about the axis of the cylinder,
   (f) wherein said framework comprises two sets of three spacers, the spacers of each set being held in a plane perpendicular to the axis of the cylinder and being at least substantially 120° with respect to each other, one of the planes being situated substantially in line with one end of said framework.

2. The device as claimed in claim 1 wherein said spacers are composed of multiple components.

3. The device as claimed in claim 1 and further comprising means for measuring the translation of said probe holder.

4. The device as claimed in claim 1 and further comprising means for measuring the rotation of said probe holder.

5. A device as recited in claim 1 wherein said means for causing said probe holder to slide along the axis of the cylinder and/or said means for causing said probe holder to pivot about the axis of the cylinder is a pneumatic type motor.

6. A device as recited in claim 1 wherein:
   (a) said probe holder has housings for receiving a plurality of measuring probes;
   (b) a plurality of measuring probes are received in said housings; and
   (c) said device further comprises means for multiplexing the measurements made by said plurality of measuring probes.

7. A device for exploring the inner volume of a cylinder, said device comprising:
   (a) a framework;
   (b) means for fixing and adjusting the position of said framework in the cylinder;
   (c) a probe holder having housings for receiving at least one measuring probe;
   (d) means for causing said probe holder to pivot about the axis of the cylinder; and
   (e) means for causing said probe holder to slide along the axis of the cylinder, said means comprising:
      (i) a shaft of polygonal section and
      (ii) a slide fixed to said framework and slidable on said shaft with minimal friction, the profile of said slide being adapted to the section of said shaft.

8. The device as claimed in claim 7 wherein said sliding means further comprise:
   (a) a driving drum and
   (b) a wire wound on said driving drum, at least one end of said wire being connected to an end of said shaft.

9. The device as claimed in claim 8 wherein said sliding means further comprise a crank handle connected to said driving drum.

10. A device as recited in claim 7 wherein said means for causing said probe holder to slide along the axis of the cylinder and/or said means for causing said probe holder to pivot about the axis of the cylinder is a pneumatic type motor.

11. A device as recited in claim 7 wherein:
 (a) said probe holder has housings for receiving a plurality of measuring probes;
 (b) a plurality of measuring probes are received in said housings; and
 (c) said device further comprises means for multiplexing the measurements made by said plurality of measuring probes.

12. A device for exploring the inner volume of a cylinder, said device comprising:
 (a) a framework;
 (b) means for fixing and adjusting the position of said framework in the cylinder;
 (c) a probe holder having housings for receiving at least one measuring probe;
 (d) means for causing said probe holder to slide along the axis of the cylinder; and
 (e) means for causing said probe holder to pivot about the axis of the cylinder, said means comprising a circular mandrel mounted for free rotation inside a polygonal shaft.

13. The device as claimed in claims 12 wherein said pivoting means further comprise an indexing hub integral with said polygonal shaft for cooperating with an indexing knob which holds said circular mandrel in position.

14. A device as recited in claim 12 wherein said means for causing said probe holder to slide along the axis of the cylinder and/or said means for causing said probe holder to pivot about the axis of the cylinder is a pneumatic type motor.

15. A device as recited in claim 12 wherein:
 (a) said probe holder has housings for receiving a plurality of measuring probes;
 (b) a plurality of measuring probes are received in said housings; and
 (c) said device further comprises means for multiplexing the measurements made by said plurality of measuring probes.

16. A device for exploring the inner volume of a cylinder, said device comprising:
 (a) a framework;
 (b) means for fixing and adjusting the position of said framework in the cylinder;
 (c) a probe holder comprising:
  (i) a plurality of housings for receiving at least one measuring probe; and
  (ii) a flange fixed to one end of a mandrel;
 (d) means for causing said probe holder to slide along the axis of the cylinder; and
 (e) means for causing said probe holder to pivot about the axis of the cylinder.

17. A device as recited in claim 16 wherein said means for causing said probe holder to slide along the axis of the cylinder and/or said means for causing said probe holder to pivot about the axis of the cylinder is a pneumatic type motor.

18. A device as recited in claim 16 wherein:
 (a) said probe holder has housings for receiving a plurality of measuring probes;
 (b) a plurality of measuring probes are received in said housings; and
 (c) said device further comprises means for multiplexing the measurements made by said plurality of measuring probes.

* * * * *